(12) United States Patent
Oechslen

(10) Patent No.: US 11,623,508 B2
(45) Date of Patent: Apr. 11, 2023

(54) DRIVE TRAIN FOR A MOTOR VEHICLE HAVING A DIRECTLY COOLED ELECTRIC MACHINE AND A TRANSMISSION, AND A MOTOR VEHICLE

(71) Applicant: Dr. Ing. h.c. F. Porsche Aktiengesellschaft, Stuttgart (DE)

(72) Inventor: Stefan Oechslen, Stuttgart (DE)

(73) Assignee: Dr. Ing. h. c. F. Porsche AG, Stuttgart (DE)

(*) Notice: Subject to any disclaimer, the term of this patent is extended or adjusted under 35 U.S.C. 154(b) by 361 days.

(21) Appl. No.: 16/920,884

(22) Filed: Jul. 6, 2020

(65) Prior Publication Data

US 2021/0001714 A1    Jan. 7, 2021

(30) Foreign Application Priority Data

Jul. 3, 2019 (DE) .................... 10 2019 117 893.2

(51) Int. Cl.
| | |
|---|---|
| B60K 11/02 | (2006.01) |
| B60L 58/26 | (2019.01) |
| H02K 11/33 | (2016.01) |
| H02K 9/197 | (2006.01) |
| H05K 7/20 | (2006.01) |

(52) U.S. Cl.
CPC ............. B60K 11/02 (2013.01); B60L 58/26 (2019.02); H02K 9/197 (2013.01); H02K 11/33 (2016.01); H05K 7/20927 (2013.01)

(58) Field of Classification Search
CPC .... B60K 1/00; B60K 11/02; B60K 2001/003; B60K 2001/005; B60K 2001/006; B60L 2240/425; B60L 2240/485; B60L 3/003; B60L 58/26; B60Y 2306/03; B60Y 2400/61; H02K 11/33; H02K 9/197; H05K 7/20927; Y02T 10/64; Y02T 10/70
USPC .......................................... 310/54
See application file for complete search history.

(56) References Cited

U.S. PATENT DOCUMENTS

| | | | | |
|---|---|---|---|---|
| 2,698,911 A | * | 1/1955 | Schaefer | H02K 5/1285 310/86 |
| 4,092,555 A | * | 5/1978 | Ying | F16D 3/06 464/41 |
| 5,519,269 A | * | 5/1996 | Lindberg | H02K 9/19 310/58 |
| 6,177,734 B1 | * | 1/2001 | Masberg | H02K 11/048 290/40 C |
| 6,624,542 B1 | * | 9/2003 | Gabrys | H02K 19/103 310/74 |
| 6,762,520 B1 | * | 7/2004 | Ehrhart | H02K 1/20 310/86 |
| 8,169,110 B2 | * | 5/2012 | Swales | H02K 9/19 310/58 |

(Continued)

*Primary Examiner* — Alex W Mok
(74) *Attorney, Agent, or Firm* — Gerald E. Hespos; Michael J. Porco

(57) ABSTRACT

A drive train (1) for a motor vehicle (100) has an electric machine (2) with a rotor (3), a stator (4) and an air gap (5) between the rotor (3) and the stator (4). The drive train (1) also has a transmission (6) and a cooling circuit (7) for conducting a coolant through the electric machine (2) and the transmission (6). The coolant is provided for lubricating and cooling the transmission (6) and for directly cooling electrical conductors of the stator (4). The cooling circuit (7) is provided in such a way that the coolant does not enter the air gap (5).

9 Claims, 4 Drawing Sheets

(56) References Cited

U.S. PATENT DOCUMENTS

| | | | | |
|---:|---|---|---|---|
| 8,555,826 | B2* | 10/2013 | Feldhaus | F01P 7/165 |
| | | | | 123/41.31 |
| 8,556,011 | B2* | 10/2013 | Anwar | B60W 30/1843 |
| | | | | 180/65.275 |
| 9,614,416 | B2* | 4/2017 | Schrage | H02K 9/06 |
| 9,762,106 | B2* | 9/2017 | Gauthier | H02K 9/19 |
| 9,846,002 | B2* | 12/2017 | Berry | G01K 13/02 |
| 10,158,263 | B2* | 12/2018 | Dlala | H02K 15/024 |
| 10,252,597 | B2* | 4/2019 | Wallace | B60L 58/27 |
| 2007/0284157 | A1* | 12/2007 | Heller | H02K 11/0094 |
| | | | | 180/54.1 |

* cited by examiner

DRIVE TRAIN FOR A MOTOR VEHICLE HAVING A DIRECTLY COOLED ELECTRIC MACHINE AND A TRANSMISSION, AND A MOTOR VEHICLE

CROSS REFERENCE TO RELATED APPLICATION

This application claims priority under 35 USC 119 to German Patent Appl. No. 10 2019 117 893.2 filed on Jul. 3, 2019, the entire disclosure of which is incorporated herein by reference.

BACKGROUND

Field of the Invention

The invention relates to a drive train for a motor vehicle having a directly cooled electric machine and a transmission, as well as a motor vehicle.

Related Art

The continuously available power of drive trains with electric machines usually is limited by the thermal limits of the electric machines. In addition to the heat resistance of the installed components, the cooling of the electric machine plays a decisive role. The dissipation of heat by fluid cooling is known from the prior art. For this purpose, a housing of the electric machine contains a cooling geometry through which a fluid coolant flows. The heat generated in the machine is dissipated into the coolant by means of heat conduction and convection.

The winding heads of the stator of the electric machine are usually the hottest and define the power-limiting component. Therefore, the prior art has examples of cooling the winding heads directly by rinsing them with coolant. Coolant also can be conducted directly through the stator grooves in which the electrical conductors of the winding of the stator are arranged along an axial direction of the the electric machine. However, high friction losses occur in the electric machine if the coolant enters the air gap between the stator and the rotor.

In addition to the electric machine, the drive train of a motor vehicle usually has at least one transmission that has to be lubricated and under certain circumstances also cooled. Using a coolant and an additional lubricant for the operation of the drive train is uneconomic and gives rise to unnecessary weight and requires a large amount of installation space.

An object of the invention therefore is to provide a drive train that does not have the above-described disadvantages of the prior art but instead is significantly improved in comparison with the prior art.

SUMMARY

One aspect of the invention relates to a drive train for a motor vehicle, having an electric machine with a rotor and a stator as well as an air gap between the rotor and the stator; a transmission and a cooling circuit for conducting a coolant through the electric machine and the transmission. The coolant is provided for lubricating and cooling the transmission and for directly cooling electrical conductors of the stator. The cooling circuit is provided in such a way that the coolant does not enter the air gap.

The drive train permits both the electric machine and the transmission to be cooled and the transmission to be lubricated without an additional lubricant being necessary. The number of media in the vehicle can be reduced by using the same medium for the cooling and lubrication. This enables a lower purchase price, a lower susceptibility to faults and less expenditure on manufacturing and servicing the vehicle. In addition, optimum cooling of the individual components of the drive train can be achieved. Demand-based temperature-control is possible, for example, by virtue of the fact that the power loss of the electric machine at a cold start can be used directly, and without further resources such as a heating means, for heating the transmission. As a result, the efficiency of the transmission at a cold start is improved considerably. The cooling of the electric machine is very effective since it is configured as direct cooling. As a result, despite the cooling of the stator no coolant enters the air gap, thereby keeping friction between the stator and rotor minimal. Disadvantages do not arise from drag losses as with the concept of wet-running electric machines.

The cooling circuit may have a pump for pumping the coolant and may have a filter for filtering the coolant.

Stator grooves of the stator may be separated with a can in a fluid-tight fashion from a rotor space in which the rotor is arranged. This advantageously makes possible a reliable seal of the air gap and therefore prevents coolant from entering the air gap. The can may be made from fiber reinforced plastic.

The can may be laminated into the electric machine, or the can may be inserted into the electric machine. Laminating in the can permits very good geometric adaptation of the can to the air-gap-side wall of the stator and therefore helps to keep the distance between the rotor and stator small, thereby improving the power of the electric machine. The insertion of the previously fabricated can is more cost-effective and can occur independently of the fabrication of the electric machine.

The stator grooves may be part of the cooling circuit. This permits direct cooling of the electrical conductors of the winding of the stator. If coolant flows through the stator grooves, the coolant flows around the electrical conductors and cools them directly and very effectively.

The coolant may be an oil that permits excellent lubrication of the transmission. The oil preferably has low viscosity.

The coolant may be a dielectric. This advantageously has the effect of cooling by direct application of coolant to the object to be cooled. Electric short-circuits are therefore avoided. Alternatively or additionally, it is possible to isolate components which are directly cooled and which conduct electric current.

The cooling circuit may be configured to cool the rotor. This makes less costly cooling of the rotor possible. Coolant may be introduced into the rotor in parallel with the stator. It is also conceivable that the part of the cooling circuit through the rotor is throttled in comparison with the part of the cooling circuit through the stator so that less coolant flows through the rotor than through the stator. However, coolant may flow through the rotor and the stator successively.

The cooling circuit may have a heat exchanging device for transferring heat from the coolant to a further medium. The heat exchanging device may be a heat exchanger or the heat exchanging device may be a chiller. The further medium can be, for example, ambient air.

The drive train may have a further cooling circuit. The further cooling circuit may be configured to cool a battery of the drive train with a further coolant. The heat exchanging device may be configured to transfer heat from the coolant to the further coolant. Thus, cooling circuits with different temperature levels may be used to cool parts of the drive train that generate different amounts of heat. For example, the further cooling circuit may have a temperature level that is lower during operation of the drive train than the cooling circuit. The further coolant may be a water-glycol mixture. The further cooling circuit may have a further pump for pumping the further coolant and/or a further filter for filtering the further coolant and/or a further heat exchanging device for transmitting heat from the further coolant to a further medium, such as ambient air.

The drive train may have power electronics. The power electronics may be cooled least partially with the coolant in a direct fashion and/or the power electronics may be cooled at least partially with the further coolant. The power electronics may have a cooling plate, and the further cooling circuit may be configured to permit the further coolant to flow around the cooling plate. The cooling circuit may be configured to permit the coolant to flow around an intermediate circuit capacitor of the power electronics and/or electrical switching elements of the power electronics and/or one or more busbars of the power electronics. Thus, components of the power electronics from which different amounts of heat have to be dissipated may be cooled individually. More particularly, components of the power electronics that generate a large amount of heat and/or are very temperature-sensitive can be cooled with a cooling circuit with a lower temperature level than components that are less sensitive to temperature.

The invention also relates to an electric machine having the above-described stator.

The invention also relates to a motor vehicle having the above-described drive train.

All the details, features and advantages disclosed above relate both to the drive train and to the motor vehicle.

Further details, features and advantages of the invention emerge from the drawings and from the following description of preferred embodiments with reference to the drawings. The drawings illustrate here merely exemplary embodiments of the invention which do not limit the inventive concept.

DETAILED DESCRIPTION

In the various figures, identical parts are provided with the same reference symbols and are therefore generally also each specified or mentioned only once.

Figure 1:
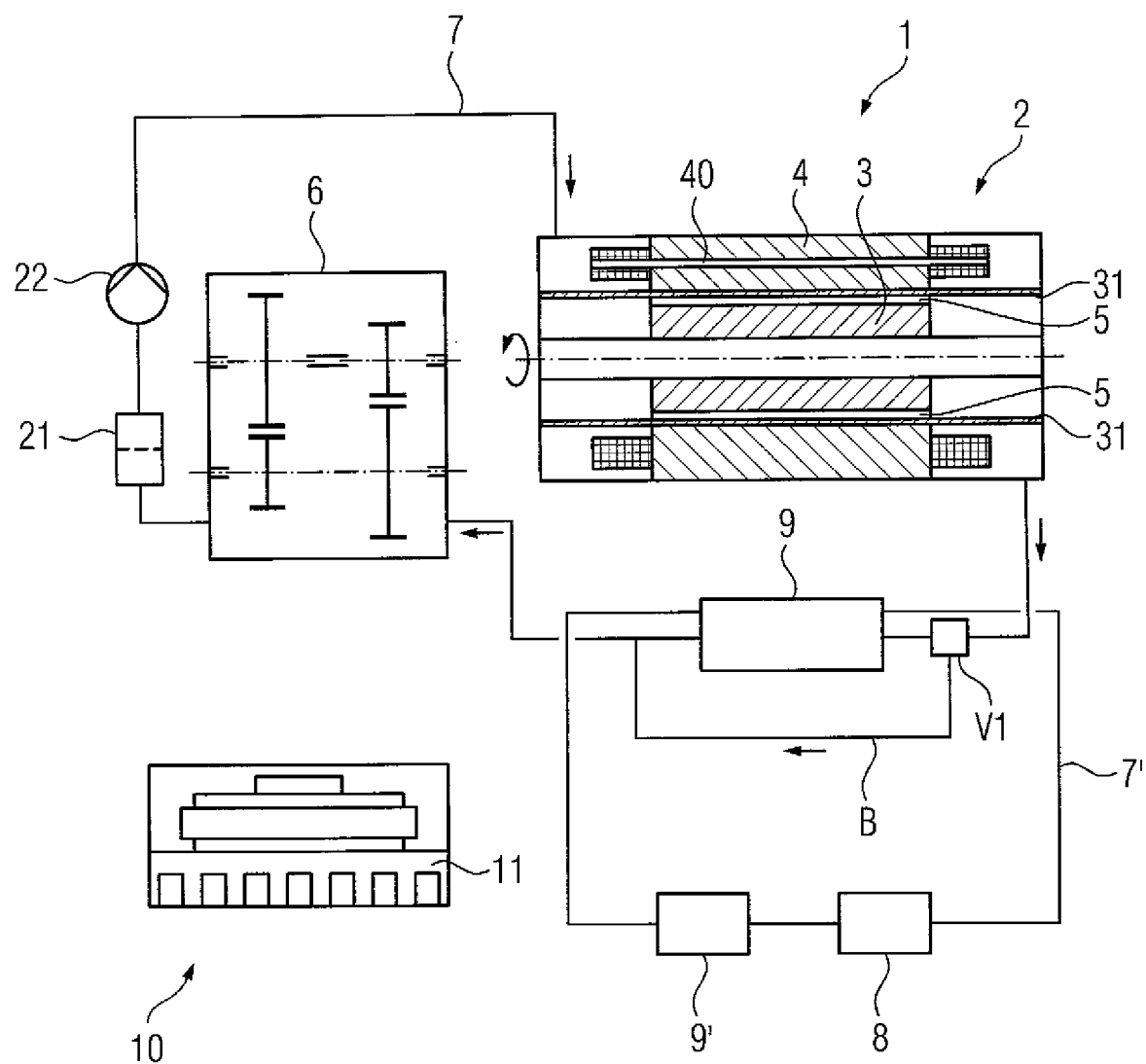
FIG. 1 is a schematic illustration of a drive train according to a first embodiment of the invention.

FIG. 1 is a schematic illustration of a drive train 1 according to an embodiment of the invention. The drive train 1 has an electric machine 2 with a stator 4 and a rotor 3. Electrical conductors (not illustrated) that form a winding of the stator 4 are arranged in stator grooves 4 of the stator 4. Furthermore, the drive train 1 has the transmission 6. The electric machine 2, in particular the stator 4 thereof, and the transmission 6 heat up during the operation of the drive train 1 and have to be cooled. In addition it is necessary for the transmission 6 to be lubricated. To ensure effective drive cooling, the stator 4 and the transmission 6 are cooled directly by a coolant that circulates in a cooling circuit 7. The direct application of the fluid coolant to the components to be cooled is particularly effective. The coolant serves for cooling and also for lubricating the transmission 6. For this purpose, the coolant of one embodiment is a gear oil. The coolant is dielectric, that is to say electrically non-conductive to permit direct cooling of the stator 4 and the electrical conductors that run in the stator grooves 40. Coolant is pumped directly through the stator grooves 40 to cool the stator 4. The stator grooves 40 are therefore part of the cooling circuit 7. The cooling circuit 7 also has a filter 21 for filtering the coolant, and a pump 22 for pumping the coolant.

To achieve a high efficiency level of the electric machine 2, it is important to avoid friction during the operation of the electric machine 2. The ingress of coolant into an air gap 5 between the stator 4 and rotor 3 would inevitably lead to friction. Thus, a can 31 made of fiber-reinforced plastic is laminated into the electric machine 2. The can 31 seals off the stator 4 and, in particular, the stator grooves 40 in a fluid-tight fashion from the rotor space and, in particular, from the air gap 5. The air gap 5 therefore remains free of coolant.

A further coolant circuit 7' is provided to cool a battery 8 of the drive train 1, and a further coolant, such as a water-glycol mixture, is pumped through the further cooling circuit 7'. The further coolant is electrically conductive, and hence the battery 8 is cooled only indirectly. A heat exchanging device 9 permits heat transfer from the coolant of the cooling circuit 7 to the further coolant of the further cooling circuit 7'. For this purpose, the further cooling circuit 7' is adjusted to a lower temperature level than the cooling circuit 7 during the operation of the drive train 1. A valve V1 enables the coolant to be conducted around the heat exchanging device 9 via a bypass B. A further heat exchanging device 9' of the further cooling circuit permits heat to be transferred from the further coolant to a further medium, for example the ambient air.

The drive train 1 also has power electronics 10 that are cooled indirectly via a cooling plate 11.

Figure 2:
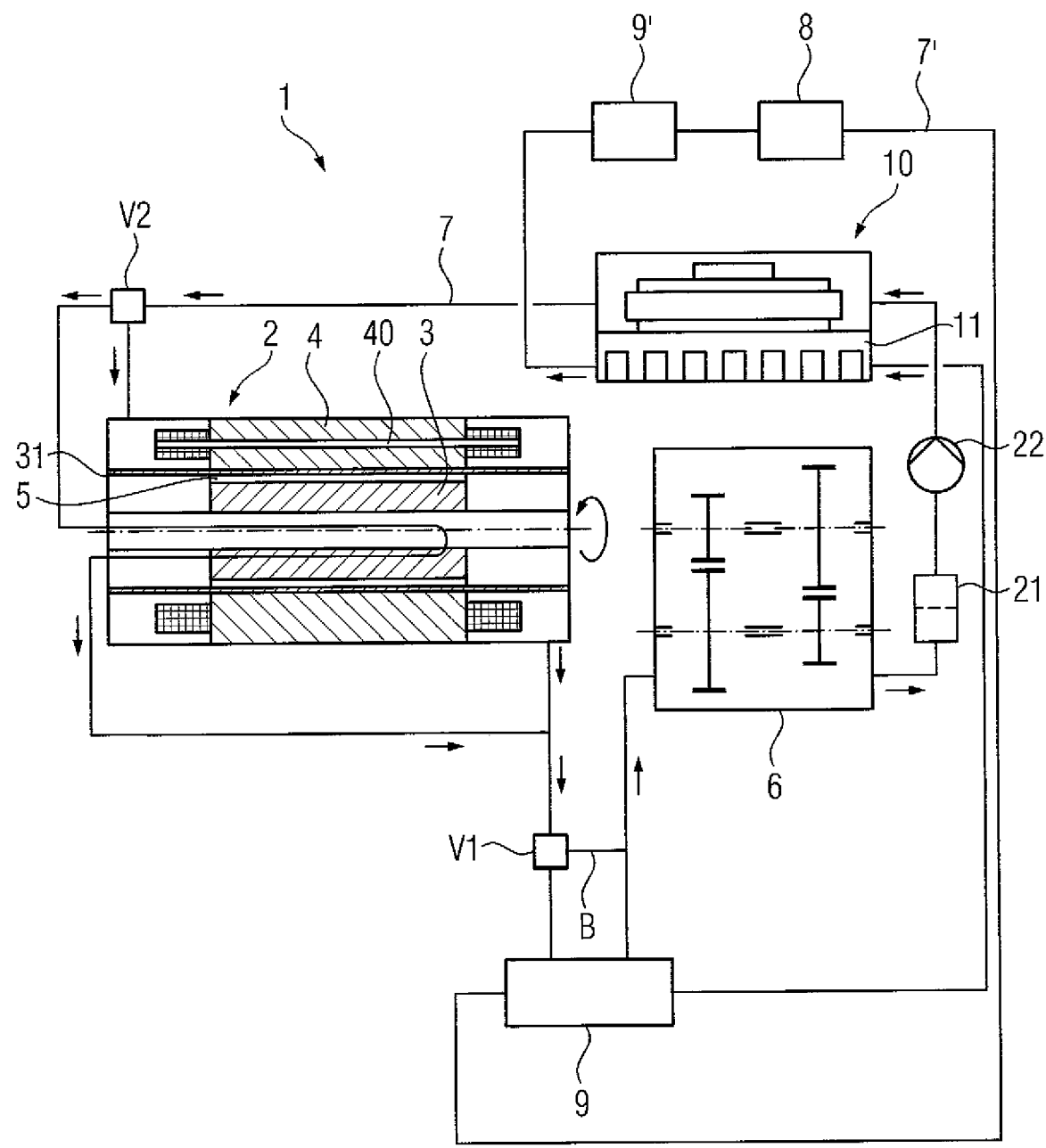
FIG. 2 is a schematic illustration of a drive train according to a second embodiment of the invention.

FIG. 2 is a schematic illustration of a drive train 1 according to a second embodiment of the invention. The drive train 1 shown in FIG. 2 differs from the drive train 1 shown in FIG. 1 in that the coolant also flows through and cools the rotor 3. Also, the power electronics 10 are cooled both by the cooling circuit 7 and the further cooling circuit 7'.

The stator 4 and the rotor 3 are arranged in the cooling circuit 7 in such a way that coolant flows through them in parallel with one another. The further valve V2 can be adjusted in a gradual fashion to regulate the ratio of the throughflow of coolant through the stator 4 and the throughflow of coolant through the rotor 3 in such a way that the ratio is to the ratio of the quantity of heat to be dissipated. The quantity of heat of the stator 4 that is to be dissipated during operation of the drive train 1 is usually significantly larger than the quantity of heat of the rotor 3 that is to be dissipated. Thus, the throughflow of coolant through the stator 4 is greater than the throughflow of coolant through the rotor 3.

The power electronics 10 have various components that output different amounts of heat. Components that output a large amount of heat are, for example, busbars or switching elements. In the embodiment illustrated here, they are cooled directly by the coolant of the cooling circuit 7. Other components of the power electronics 10 give off less heat. These other components are cooled indirectly via the cooling plate 11, around which the further coolant of the further cooling circuit 7' flows.

Figure 3:
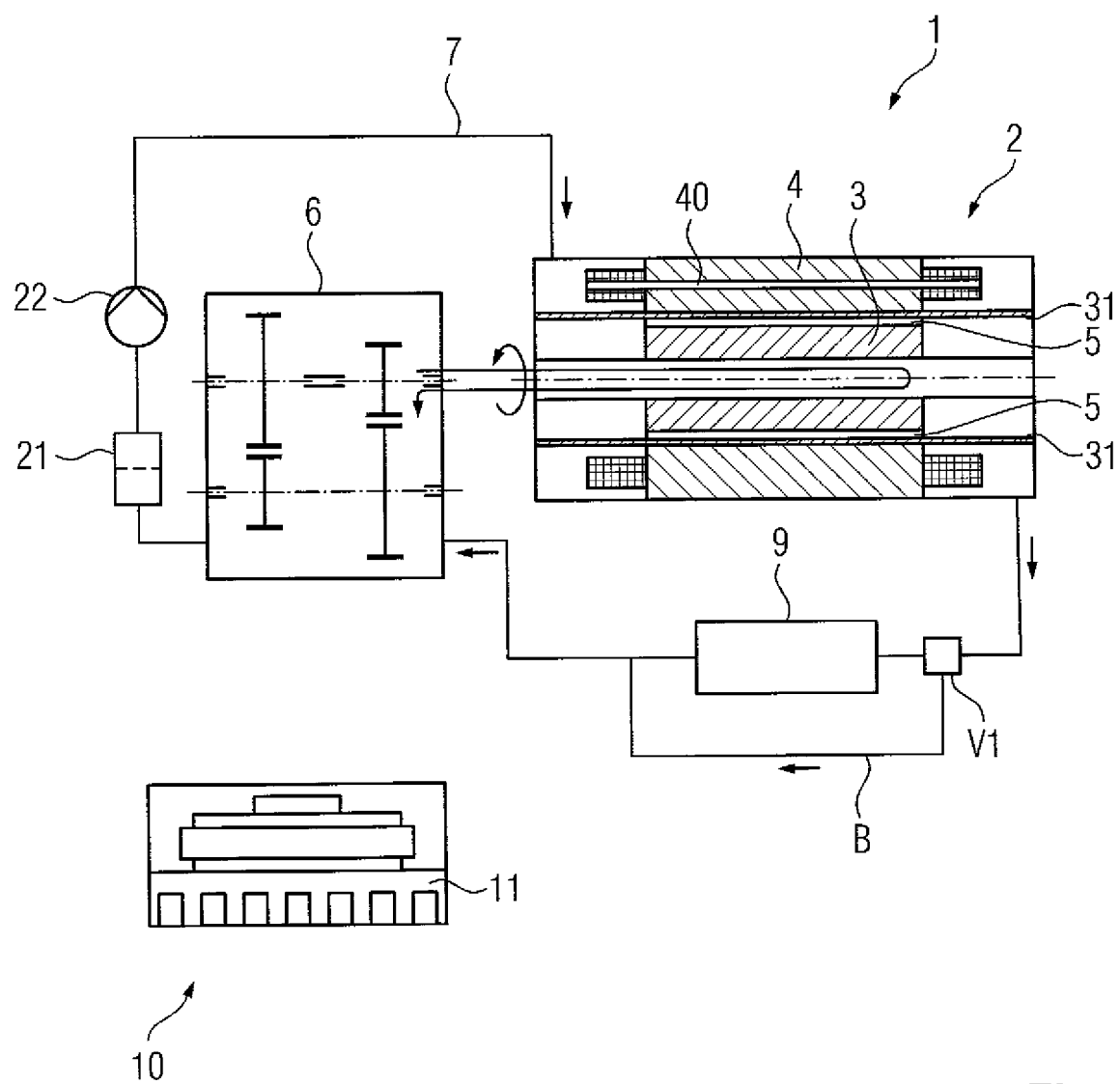
FIG. 3 is a schematic illustration of a drive train according to a third exemplary embodiment of the invention.

FIG. 3 is a schematic illustration of a drive train 1 according to a third embodiment of the invention. The drive train 1 of FIG. 3 differs from the drive train 1 of FIG. 1 in that the coolant also flows through and cools the rotor 3. In this context, the coolant flows directly from the transmission 6 into the rotor 3. The transmission 6 forms a coolant reservoir, as it does also in the embodiments illustrated in FIGS. 1 and 2.

Figure 4:
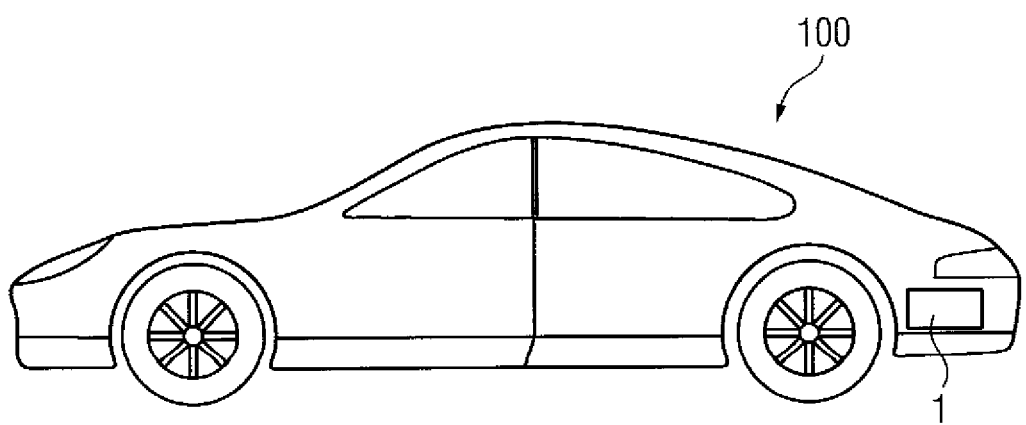
FIG. 4 is a schematic illustration of a motor vehicle according to an embodiment of the invention.

FIG. 4 is a schematic illustration of a motor vehicle 100 according to an embodiment of the invention with a drive train 1 according to an embodiment of the invention.

What is claimed is:

1. A drive train for a motor vehicle, comprising:
   an electric machine with a rotor, a stator having stator grooves, an air gap arranged between the rotor and the stator and a can separating the stator from both the rotor and the air gap in a fluid tight fashion;
   a transmission;
   a first cooling circuit for conducting a first coolant through the electric machine and the transmission;
   a first heat exchange device disposed to transfer heat between the first coolant in the first cooling circuit and a further medium;
   a first valve in the first cooling circuit at a position to receive the first coolant from the electric machine and to direct the first coolant to at least one the first heat exchange device and the transmission;
   a second valve in the first cooling circuit at a position to receive the first coolant from the transmission, a first branch extending from the second valve, through the stator and to the first valve, and a second branch extending from the second valve, through the rotor and to the first valve, the second valve regulating flow of the first coolant through the stator and the rotor,
   wherein the first coolant is provided for lubricating and cooling the transmission and for directly cooling electrical conductors of the stator, and wherein the can of the first cooling circuit is provided so that the first coolant does not enter the air gap.

2. The drive train of claim 1, wherein the can is laminated into the electric machine.

3. The drive train of claim 1, wherein the can is inserted into the electric machine.

4. The drive train of claim 1, wherein the stator grooves are part of the first cooling circuit.

5. The drive train of claim 1, wherein the first coolant is an oil.

6. The drive train of claim 1, wherein the first coolant is dielectric.

7. The drive train of claim 1, wherein the drive train has a battery and a second cooling circuit that is configured to cool the battery of the drive train with a second coolant, and wherein the first heat exchanging device is configured to transfer heat from the first coolant to the second coolant.

8. The drive train of claim 7, further comprising second cooling circuit being configured to permit the further second coolant to flow around the cooling plate, and the first cooling circuit being configured to permit the first coolant to flow around at least one of an intermediate circuit capacitor of the power electronics, electrical switching elements of the power electronics and one or more busbars of the power electronics.

9. A motor vehicle having the drive train of claim 1.

* * * * *